(12) United States Patent
Yang

(10) Patent No.: US 12,660,433 B2
(45) Date of Patent: Jun. 16, 2026

(54) DISPLAY PANEL

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventor: Hong Yang, Huizhou (CN)

(73) Assignees: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 877 days.

(21) Appl. No.: 17/620,767

(22) PCT Filed: Nov. 30, 2021

(86) PCT No.: PCT/CN2021/134556
§ 371 (c)(1),
(2) Date: Dec. 20, 2021

(87) PCT Pub. No.: WO2023/087395
PCT Pub. Date: May 25, 2023

(65) Prior Publication Data
US 2024/0049530 A1 Feb. 8, 2024

(30) Foreign Application Priority Data
Nov. 18, 2021 (CN) .......................... 202111367341.9

(51) Int. Cl.
*H10K 59/131* (2023.01)
*H10K 102/00* (2023.01)

(52) U.S. Cl.
CPC ..... *H10K 59/131* (2023.02); *H10K 2102/311* (2023.02)

(58) Field of Classification Search
CPC combination set(s) only.
See application file for complete search history.

(56) References Cited

U.S. PATENT DOCUMENTS

| | | | | |
|---|---|---|---|---|
| 7,697,237 B1 * | 4/2010 | Danielson | ............ | G11B 5/4846 |
| | | | | 360/245.9 |
| 2007/0181633 A1 * | 8/2007 | Erlach | ................. | H01L 21/6835 |
| | | | | 228/5.5 |
| 2010/0253607 A1 * | 10/2010 | Shiozaki | ................ | H10K 50/86 |
| | | | | 345/76 |
| 2012/0062447 A1 * | 3/2012 | Tseng | ................ | G02F 1/133305 |
| | | | | 345/33 |
| 2014/0342131 A1 * | 11/2014 | Lee | ......................... | H10K 71/60 |
| | | | | 264/105 |

(Continued)

FOREIGN PATENT DOCUMENTS

| | | |
|---|---|---|
| CN | 107132685 A | 9/2017 |
| CN | 110018597 A | 7/2019 |

(Continued)

OTHER PUBLICATIONS

International Search Report in International application No. PCT/CN2021/134556, mailed on Jun. 23, 2022.

(Continued)

*Primary Examiner* — Mark W Tornow
*Assistant Examiner* — Priya M Rampersaud
(74) *Attorney, Agent, or Firm* — PV IP PC; Peter Stecher; Wei Te Chung

(57) ABSTRACT

A display panel is provided, including a metal layer and an elastic conductive layer disposed on a surface of the metal layer. A tensile strength of the elastic conductive layer is greater than a tensile strength of the metal layer. The elastic (Continued)

conductive layer can protect and buffer the metal layer during rolling or bending of the display panel, to effectively avoid the breakage of the metal layer caused by stress concentration.

20 Claims, 7 Drawing Sheets

(56)                 References Cited

U.S. PATENT DOCUMENTS

| | | | |
|---|---|---|---|
| 2015/0179722 A1 | 6/2015 | Koo | |
| 2015/0221680 A1* | 8/2015 | Nakata | H10D 86/0212 |
| | | | 349/40 |
| 2019/0051675 A1* | 2/2019 | Ma | H10D 86/60 |
| 2020/0091272 A1* | 3/2020 | Qin | H10K 59/1315 |
| 2020/0219907 A1* | 7/2020 | Lee | H01L 23/552 |
| 2021/0202867 A1* | 7/2021 | Lin | G09G 3/035 |
| 2021/0335971 A1* | 10/2021 | Zhao | H10K 71/00 |
| 2022/0005834 A1* | 1/2022 | Lee | H10D 86/60 |
| 2022/0036771 A1* | 2/2022 | Peng | G03F 7/0007 |

FOREIGN PATENT DOCUMENTS

| | | |
|---|---|---|
| CN | 110571225 A | 12/2019 |
| CN | 110867477 A | 3/2020 |
| CN | 111063257 A | 4/2020 |
| CN | 111128026 A | 5/2020 |
| CN | 111862826 A | 10/2020 |
| CN | 112687184 A | 4/2021 |
| WO | 2020056884 A1 | 3/2020 |

OTHER PUBLICATIONS

Written Opinion of the International Search Authority in International application No. PCT/CN2021/134556, mailed on Jun. 23, 2022.
Chinese Office Action issued in corresponding Chinese Patent Application No. 202111367341.9 dated Jun. 10, 2025, pp. 1-9.
Chinese Office Action issued in corresponding Chinese Patent Application No. 202111367341.9 dated Nov. 26, 2025, pp. 1-9.

* cited by examiner $120\begin{Bmatrix}121\\122\end{Bmatrix}$  $160\begin{Bmatrix}161\\162\end{Bmatrix}$ $120\begin{Bmatrix}121\\122\end{Bmatrix}$   $160\begin{Bmatrix}161\\162\end{Bmatrix}$

1

DISPLAY PANEL

CROSS-REFERENCE TO RELATED APPLICATION

This application is a national phase application under 35 U.S.C. § 371 of PCT Application No. PCT/CN2021/134556 filed Nov. 30, 2021, which claims priority to Chinese Application No. 202111367341.9 filed Nov. 18, 2021, the contents of which are incorporated herein by reference in their entirety.

FIELD OF INVENTION

The present disclosure relates to the field of display, and in particular, to a display panel.

BACKGROUND OF INVENTION

In recent years, organic light-emitting diode (OLED) display screens have received much attention and found wide applications due to advantages such as high contrast, wide viewing angle, and especially bendability. As the technology becomes increasingly mature, flexible display screens gradually appear in booths.

The flexible display screens require to be rolled or bent during use or even frequently bent. As the number of times of bending increases, wires are prone to breakage, among other problems. As a result, a wiring resistance increases, and brightness of the display screens is reduced, resulting in poor display.

SUMMARY OF INVENTION

Technical Problem

Embodiments of the present disclosure provide a display panel, to resolve a technical problem that a rigid structure such as a wire and an insulating layer of a flexible display screen breaks during rolling or bending.

Technical Solution

An embodiment of the present disclosure provides a display panel, including:

a metal layer; and an elastic conductive layer, disposed on a surface of the metal layer, wherein a tensile strength of the elastic conductive layer is greater than a tensile strength of the metal layer.

Optionally, in some embodiments of the present disclosure, the tensile strength of the elastic conductive layer is between 800 N/mm$^2$ and 1500 N/mm$^2$.

Optionally, in some embodiments of the present disclosure, a material of the elastic conductive layer is beryllium bronze or titanium bronze.

Optionally, in some embodiments of the present disclosure, the metal layer includes a signal line, the elastic conductive layer is disposed on a surface of the signal line, and a part of the elastic conductive layer corresponding to the signal line is in a concave-convex shape in an extending direction of the signal line.

Optionally, in some embodiments of the present disclosure, the display panel further includes a first substrate, an active layer, a first insulating layer, a second insulating layer, and a third insulating layer, wherein

2 the metal layer includes a first metal layer and a second metal layer;

the active layer is disposed on the first substrate, the first insulating layer is disposed on the active layer, the first metal layer is disposed on the first insulating layer, the second insulating layer covers the active layer and the first metal layer, the active layer is disposed on the second insulating layer, and the third insulating layer covers the second metal layer and the second insulating layer; and the elastic conductive layer is disposed on at least one surface of a surface of a side of the first metal layer close to the first insulating layer, a surface of a side of the first metal layer away from the first insulating layer, a surface of a side of the second metal layer close to the second insulating layer or a surface of a side of the second metal layer close to the third insulating layer.

Optionally, in some embodiments of the present disclosure, the first metal layer includes a gate and a gate line, the gate is disposed corresponding to the active layer, and the gate is connected to the corresponding gate line; and the second metal layer includes a source, a drain, and a data line, the source is in contact with one end of the corresponding active layer, the drain is in contact with the other end of the corresponding active layer, and the source is connected to the corresponding data line.

Optionally, in some embodiments of the present disclosure, the gate line is in a concave-convex shape in an extending direction of the gate line; and/or the data line is in a concave-convex shape in an extending direction of the data line.

Optionally, in some embodiments of the present disclosure, the display panel further includes a first substrate, an active layer, a first insulating layer, a second insulating layer, a third insulating layer, and a fourth insulating layer, wherein the metal layer includes a first metal layer and a second metal layer;

the fourth insulating layer is disposed on the first substrate, the first metal layer is disposed on the fourth insulating layer, the first insulating layer covers the first metal layer, the active layer is disposed on the first insulating layer, the second insulating layer covers the active layer, the second metal layer is disposed on the second insulating layer, and the third insulating layer covers the second metal layer; and the elastic conductive layer is disposed on at least one surface of a surface of a side of the first metal layer close to the first insulating layer, a surface of a side of the first metal layer close to the fourth insulating layer, a surface of a side of the second metal layer close to the second insulating layer or a surface of a side of the second metal layer close to the third insulating layer.

Optionally, in some embodiments of the present disclosure, the first metal layer includes a gate and a gate line, the gate is disposed corresponding to the active layer, and the gate is connected to the corresponding gate line; and the second metal layer includes a source, a drain, and a data line, the source is in contact with one end of the corresponding active layer, the drain is in contact with the other end of the corresponding active layer, and the source is connected to the corresponding data line.

Optionally, in some embodiments of the present disclosure, the gate line is in a concave-convex shape in an extending direction of the gate line; and/or the data line is in a concave-convex shape in an extending direction of the data line.

Optionally, in some embodiments of the present disclosure, the metal layer further includes a third metal layer disposed between the first substrate and the active layer, a fourth insulating layer disposed between the third metal layer and the active layer, and a fifth insulating layer disposed between the third metal layer and the first substrate.

Optionally, in some embodiments of the present disclosure, the elastic conductive layer is disposed on a surface of a side of the third metal layer close to the fourth insulating layer; and/or
    the elastic conductive layer is disposed on a surface of a side of the third metal layer close to the fifth insulating layer.

Optionally, in some embodiments of the present disclosure, the metal layer further includes a third metal layer disposed between the first substrate and the fourth insulating layer and a fifth insulating layer disposed between the first substrate and the third metal layer.

Optionally, in some embodiments of the present disclosure, the elastic conductive layer is disposed on a surface of a side of the third metal layer close to the fourth insulating layer; and/or
    the elastic conductive layer is disposed on a surface of a side of the third metal layer close to the fifth insulating layer.

Optionally, in some embodiments of the present disclosure, the third metal layer includes a mask block and a clock signal line, the mask block is disposed corresponding to the active layer, and the mask block is connected to the clock signal line.

Optionally, in some embodiments of the present disclosure, the clock signal line is in a concave-convex shape in an extending direction of the clock signal line.

Optionally, in some embodiments of the present disclosure, the third metal layer includes a clock signal line.

Optionally, in some embodiments of the present disclosure, the clock signal line is in a concave-convex shape in an extending direction of the clock signal line.

Optionally, in some embodiments of the present disclosure, the display panel further includes an insulating layer disposed on a side of the metal layer and an elastic support layer disposed between the metal layer and the insulating layer, wherein an elastic modulus of the elastic support layer is less than an elastic modulus of the insulating layer.

Optionally, in some embodiments of the present disclosure, the elastic modulus of the elastic support layer is between 1 MPa and 80 MPa.

Beneficial Effects

According to a display panel used in the embodiments of the present disclosure, an elastic conductive layer is disposed on a surface of the metal layer, wherein a tensile strength of the elastic conductive layer is greater than a tensile strength of the metal layer. The elastic conductive layer can protect and buffer the metal layer during rolling or bending of the display panel, to effectively avoid the breakage of the metal layer caused by stress concentration.

BRIEF DESCRIPTION OF DRAWINGS

To describe the technical solutions in the embodiments of the present disclosure more clearly, the following briefly describes accompanying drawings required for describing the embodiments. Apparently, the accompanying drawings in the following descriptions show merely some embodiments of the present disclosure, and a person skilled in the art may still derive other accompanying drawings from these accompanying drawings without creative efforts.

Figure 1:
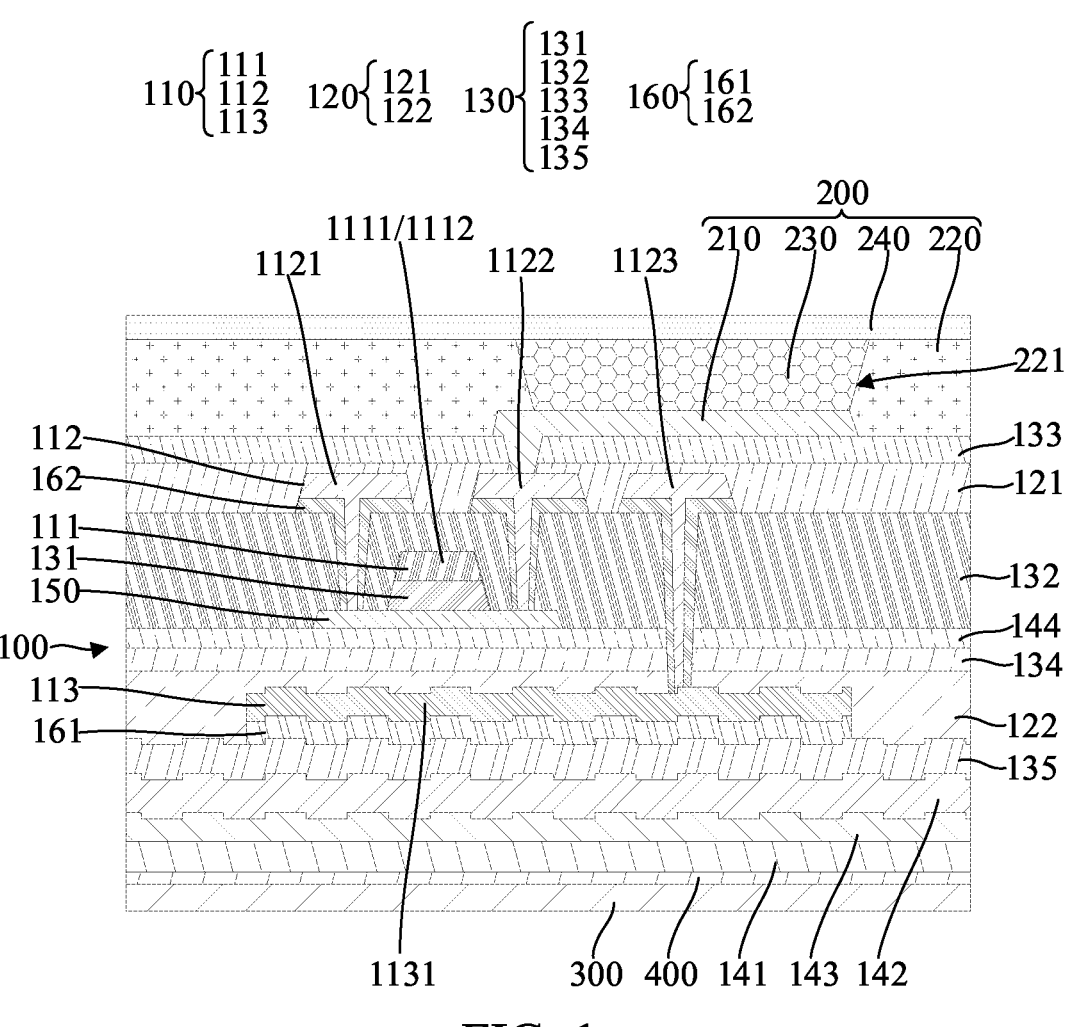

FIG. 1 is a schematic sectional view 1 of a structure of a first display panel according to an embodiment of the present disclosure.

Figure 2:
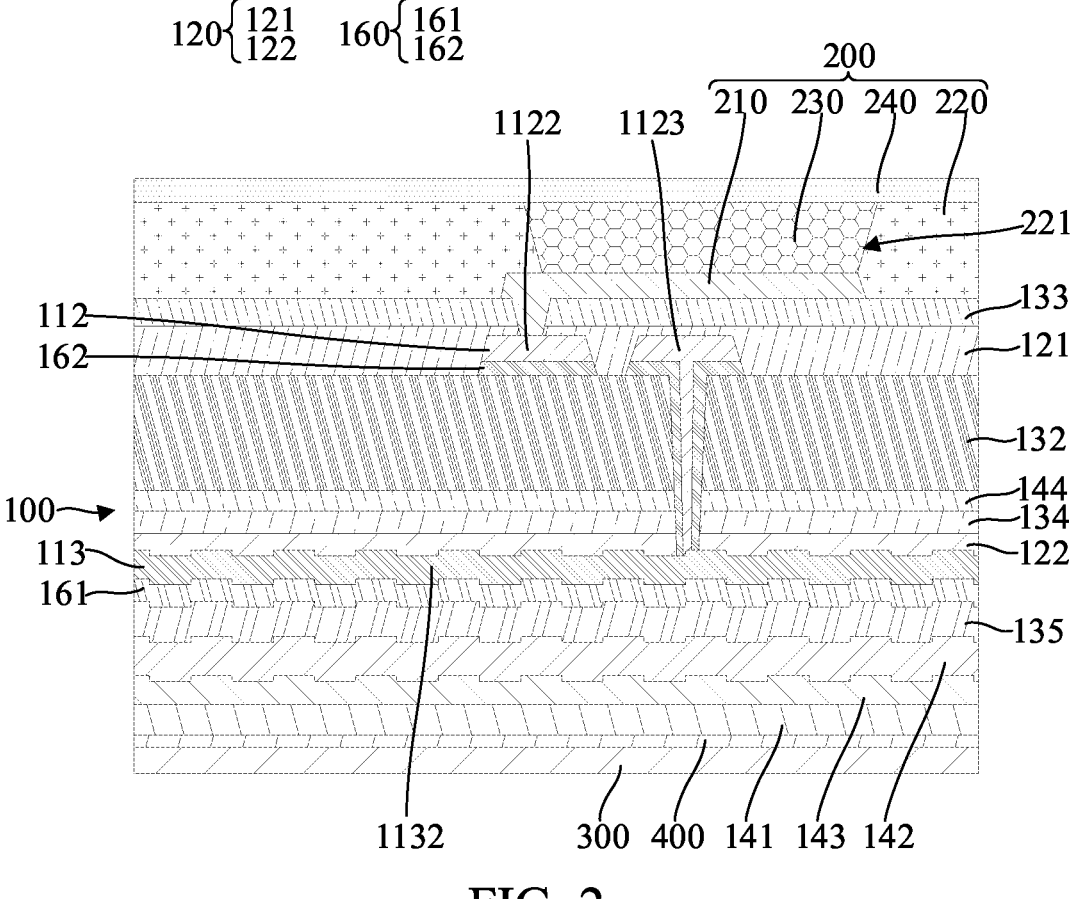

FIG. 2 is a schematic sectional view 2 of a structure of a first display panel according to an embodiment of the present disclosure.

Figure 3:
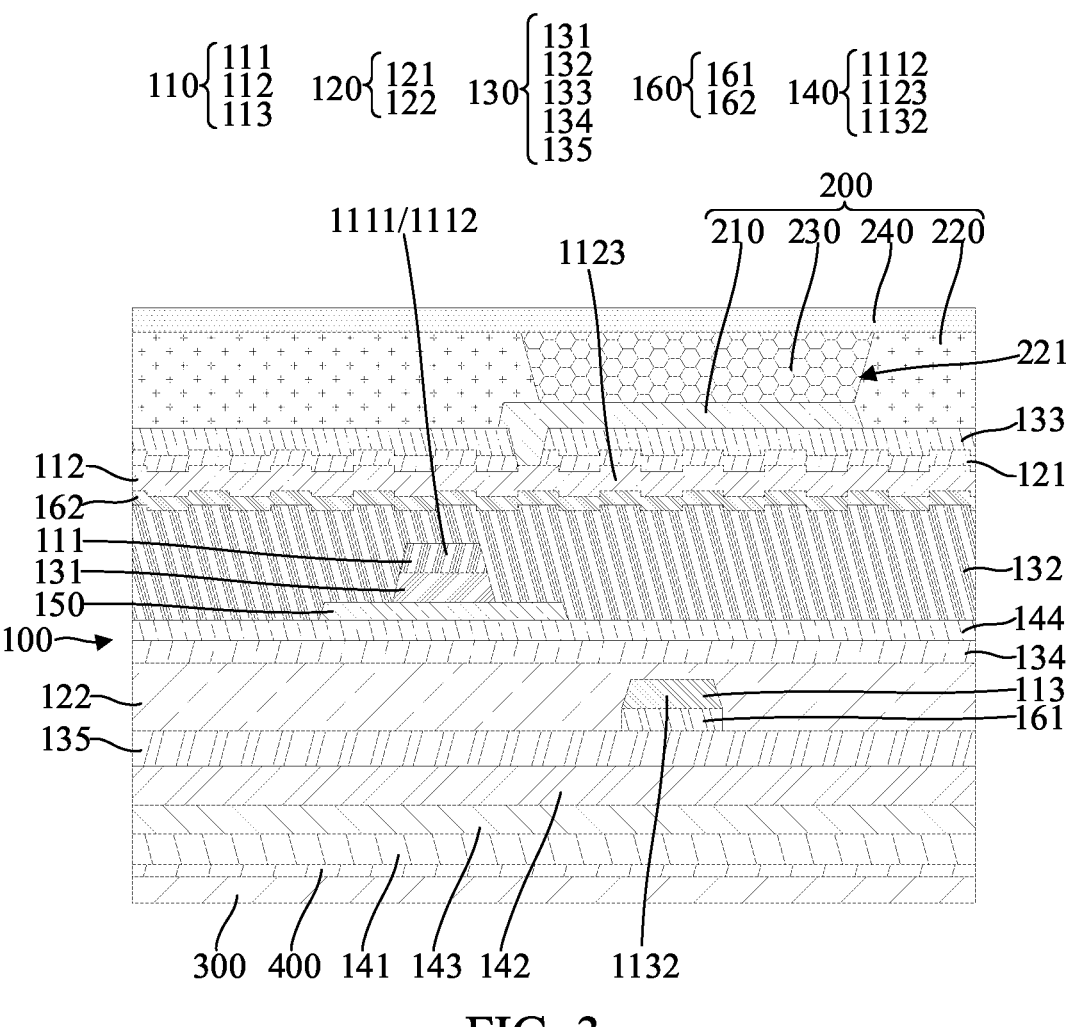

FIG. 3 is a schematic sectional view 3 of a structure of a first display panel according to an embodiment of the present disclosure.

Figure 4:
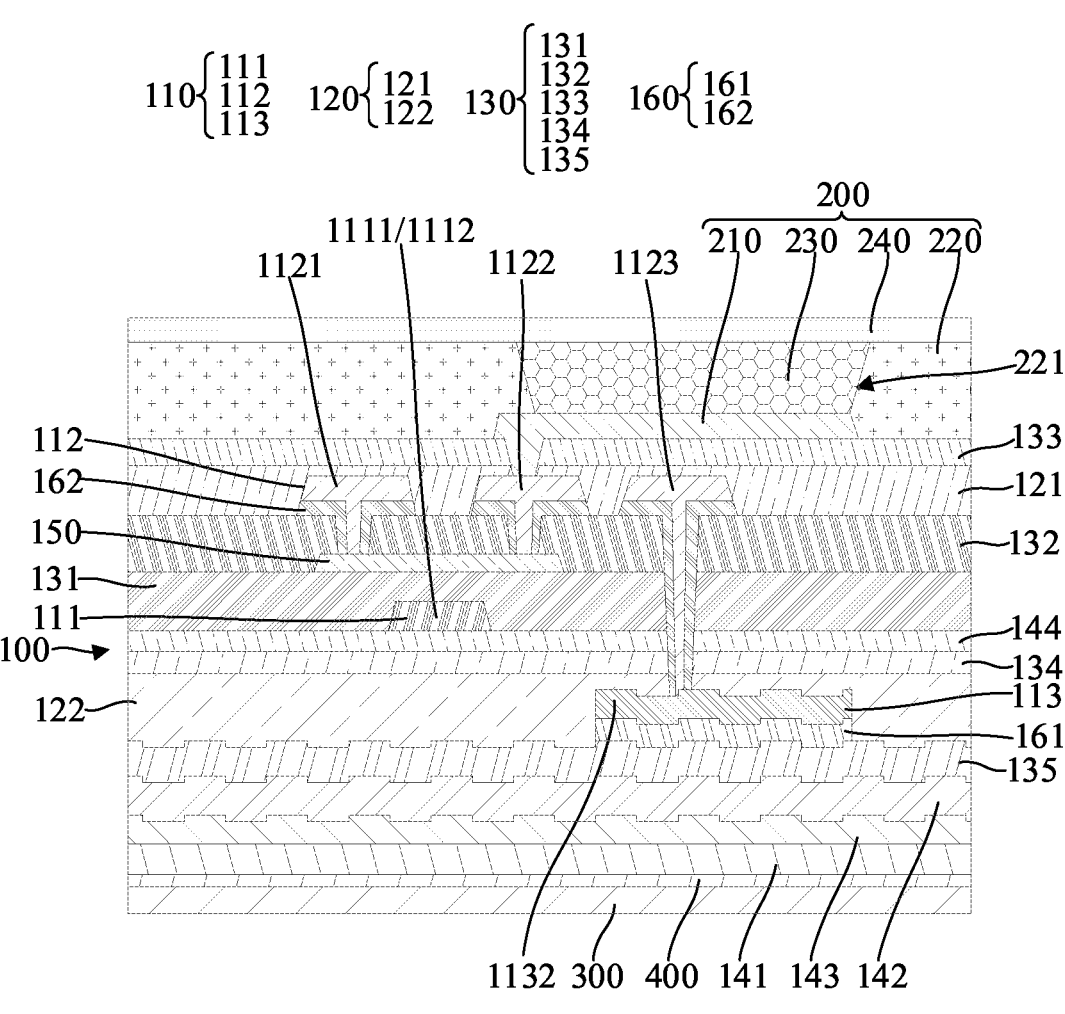

FIG. 4 is a schematic sectional view 1 of a structure of a second display panel according to an embodiment of the present disclosure.

Figure 5:
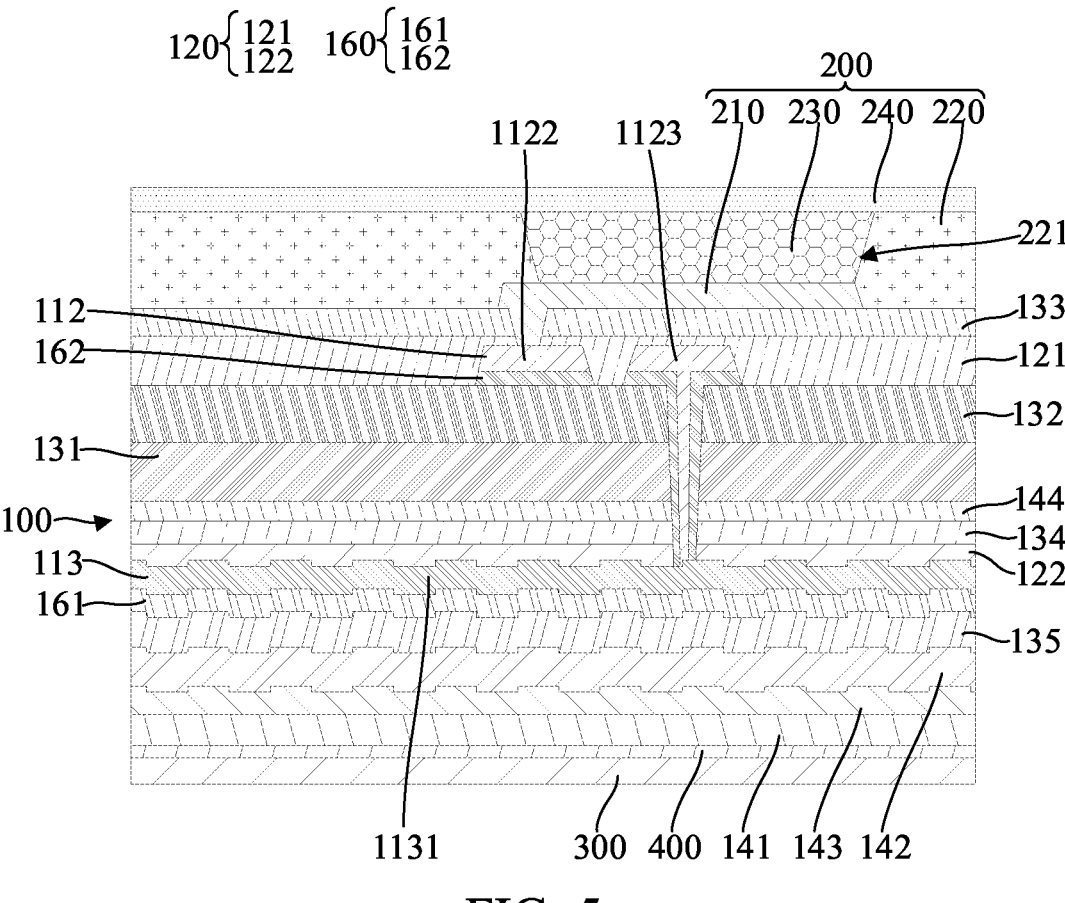

FIG. 5 is a schematic sectional view 2 of a structure of a second display panel according to an embodiment of the present disclosure.

Figure 6:
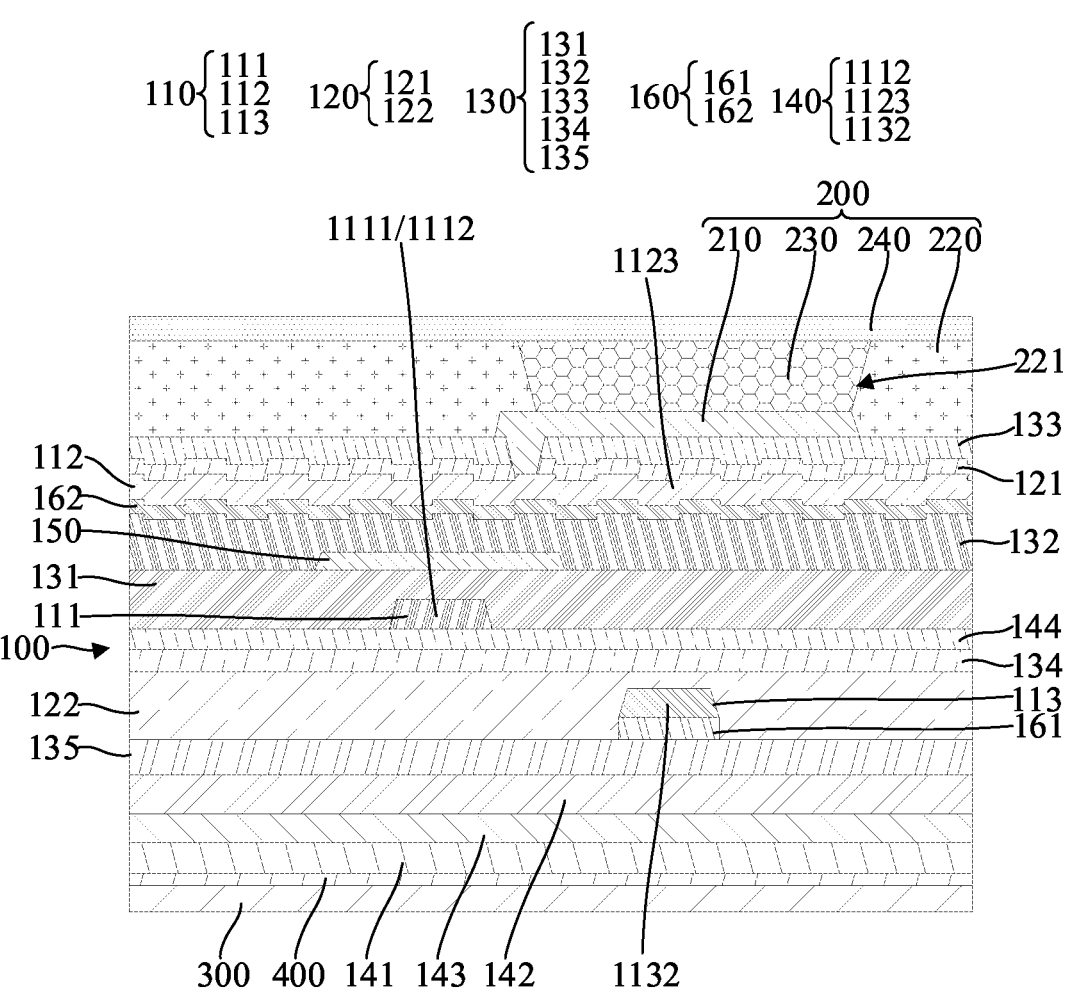

FIG. 6 is a schematic sectional view 3 of a structure of a second display panel according to an embodiment of the present disclosure.

Figure 7:
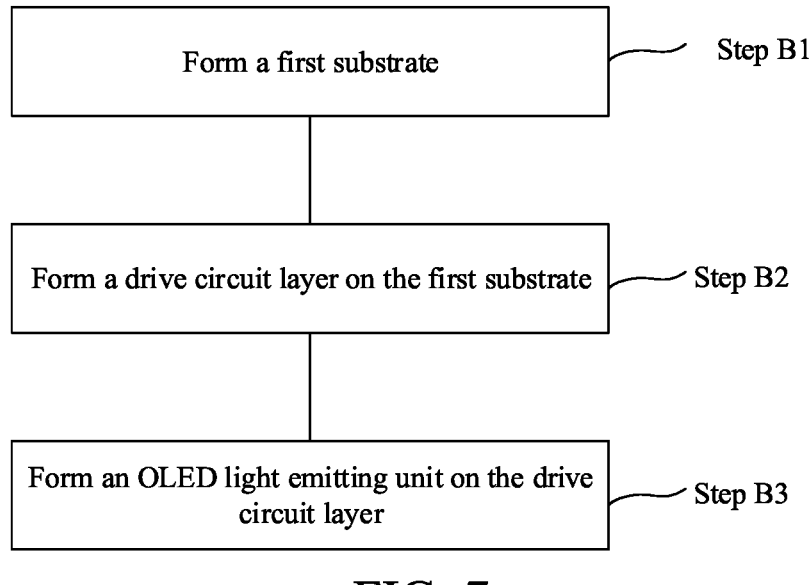

FIG. 7 is a schematic flowchart of a method for manufacturing a display panel according to an embodiment of the present disclosure.

DETAILED DESCRIPTION OF PREFERRED EMBODIMENTS

The technical solutions in the embodiments of the present disclosure are clearly and completely described below with reference to the accompanying drawings in the embodiments of the present disclosure. Apparently, the described embodiments are merely some rather than all of the embodiments of this application. All other embodiments obtained by a person skilled in the art based on the embodiments of the present disclosure without creative efforts shall fall within the protection scope of this application. In addition, it should be understood that the specific implementations described herein are merely used for describing and illustrating the present disclosure rather than limiting the present disclosure. In the present disclosure, unless otherwise specified, the directional terms, such as "upper" and "lower" usually refer to upper and lower positions of an apparatus in actual use or in a working state, which are specifically drawing directions in the accompanying drawings. In addition, "inside" and "outside" are relative to a profile of the apparatus.

An embodiment of the present disclosure provides a display panel. Detailed descriptions are separately provided below. It should be noted that a description sequence of the following embodiments is not intended to limit preference orders of the embodiments.

A first display panel shown in FIGS. 1 to 3 is a top-gate display panel. The top-gate display panel means that a thin film transistor is in a top-gate design. FIG. 1 is a schematic sectional view of a structure of a region of a thin film transistor corresponding to the first display panel. FIG. 2 is a schematic sectional view of a structure of a region of a clock signal line corresponding to the first display panel. FIG. 3 is a schematic sectional view of a structure of a region of a data line corresponding to the first display panel. A second display panel shown in FIGS. 4 to 6 is a bottom-gate display panel. The bottom-gate display panel means that a thin film transistor is in a bottom-gate design. FIG. 4 is a schematic sectional view of a structure of a region of a thin film transistor corresponding to the second display panel. FIG. 5 is a schematic sectional view of a structure of a region of a clock signal line corresponding to the second display panel. FIG. 6 is a schematic sectional view of a structure of a region of a data line corresponding to the second display panel.

Referring to FIGS. 1 to 3, an embodiment of the present disclosure provides a display panel, including a metal layer 110 and an elastic conductive layer 160 disposed on a surface of the metal layer 110. A tensile strength of the elastic conductive layer 160 is greater than a tensile strength of the metal layer 110. In the present embodiment, the elastic conductive layer 160 may be disposed on an upper surface or a lower surface of the metal layer 110 or may be disposed on an upper surface and a lower surface simultaneously.

In the display panel in the present embodiment of the present disclosure, the elastic conductive layer 160 is disposed on the surface of the metal layer 110, and the tensile strength of the elastic conductive layer 160 is greater than the tensile strength of the metal layer 110. The elastic conductive layer 160 can protect and buffer the metal layer 110 during rolling or bending of the display panel, to effectively avoid the breakage of the metal layer 110 caused by stress concentration. In addition, a resistance of a wire on the display panel may be further reduced by disposing the elastic conductive layer 160.

Specifically, as shown in FIGS. 1 to 6, the display panel further includes a first substrate 141 and an active layer 150 disposed on the first substrate 141. The first substrate 141 is made of a flexible material, which may be specifically, but not limited to, polyimide (PI). A material of the active layer 150 may be selected from one or more of metal oxide materials, such as indium gallium zinc oxide (IGZO), indium gallium zinc ti oxide (IGZTO), indium zinc oxide (IZO), and zinc ti oxide (ZTO), and a thickness of the active layer 150 is between 300 Å and 500 Å. Certainly, according to selection of an actual case and specific requirements, the material of the first substrate 141, the material of the active layer 150, and the thickness of the active layer 150 may be appropriately modified. This is not uniquely limited herein.

Specifically, the metal layer 110 includes a signal line 140. The elastic conductive layer 160 is disposed on a surface of the signal line 140. A part of the elastic conductive layer 160 corresponding to the signal line 140 is in a concave-convex shape in an extending direction of the signal line 140. That is, the surface of the signal line 140 is provided with a plurality of protruding portions and a plurality of recessed portions. The protruding portions and the recessed portions are alternately arranged in the extending direction of the signal line 140, to form the concave-convex shape. In this structure, during rolling or bending of the display panel, because the recessed portions are disposed on the surface of the signal line 140, the signal line 140 can better release a stress, to avoid the breakage of the signal line 140 caused by stress concentration. In the present embodiment, a cross-sectional shape of the recessed portion may be, but not limited to, an inverted trapezoid, an inverted triangle or an arc shape.

Specifically, as shown in FIGS. 1 to 6, the display panel further includes an insulating layer 130. The insulating layer 130 is disposed on a side of the metal layer 110. The insulating layer 130 can prevent short-circuiting between the metal layers 110 disposed in different layers.

Optionally, the display panel is a top-gate display panel. As shown in FIGS. 1 to 3, the metal layer 110 includes a first metal layer 111 and a second metal layer 112. The insulating layer 130 includes a first insulating layer 131, a second insulating layer 132, and a third insulating layer 133. Specifically, the active layer 150 is disposed on the first substrate 141. The first insulating layer 131 is disposed on the active layer 150. The first metal layer 111 is disposed on the first insulating layer 131. The second insulating layer 132 covers the active layer 150 and the first metal layer 111. The active layer 150 is disposed on the second insulating layer 132. The third insulating layer 133 covers the second metal layer 112 and the second insulating layer 132. The elastic conductive layer 160 is disposed on at least one surface of a surface of a side of the first metal layer 111 close to the first insulating layer 131, a surface of a side of the first metal layer 111 away from the first insulating layer 131, a surface of a side of the second metal layer 112 close to the second insulating layer 132 or a surface of a side of the second metal layer 112 close to the third insulating layer 133.

Optionally, the display panel may be alternatively a bottom-gate display panel, and a thin film transistor of the bottom-gate display panel specifically includes a plurality of types such as an etch stop layer (ESL) type and a back channel etch (BCE) type. As shown in FIGS. 4 to 6, the metal layer 110 includes a first metal layer 111 and a second metal layer 112. The insulating layer 130 includes a first insulating layer 131, a second insulating layer 132, a third insulating layer 133, and a fourth insulating layer 134. The fourth insulating layer 134 is disposed on the first substrate 141. The first metal layer 111 is disposed on the fourth insulating layer 134. The first insulating layer 131 covers the first metal layer 111. The active layer 150 is disposed on the first insulating layer 131. The second insulating layer 132 covers the active layer 150. The second metal layer 112 is disposed on the second insulating layer 132. The third insulating layer 133 covers the second metal layer 112. The elastic conductive layer 160 is disposed on at least one surface of a surface of a side of the first metal layer 111 close to the first insulating layer 131, a surface of a side of the first metal layer 111 close to the fourth insulating layer 134, a surface of a side of the second metal layer 112 close to the second insulating layer 132 or a surface of a side of the second metal layer 112 close to the third insulating layer 133.

Specifically, the first metal layer 111 includes a gate 1111 and a gate line 1112. The gate line 1112 is the signal line 140 of the first metal layer 111. The gate 1111 is disposed corresponding to the active layer 150. The gate 1111 is connected to the corresponding gate line 1112. The second metal layer 112 includes a source 1121, a drain 1122, and a data line 1123. The data line 1123 is the signal line 140 of the second metal layer 112. The source 1121 is in contact with one end of the corresponding active layer 150. The drain 1122 is in contact with the other end of the corresponding active layer 150. The source 1121 is connected to the corresponding data line 1123. In the present embodiment of the present disclosure, a plurality of gate lines 1112 are arranged at intervals, and a plurality of data lines 1123 are arranged at intervals. The gate line 1112 extends in a first direction. The data line 1123 extends in a second direction. The first direction intersects with the second direction. The first direction may be specifically, but not limited to, perpendicular to the second direction. The plurality of gate lines 1112 and the plurality of data lines 1123 divide the display panel into a plurality of pixel regions. The gate 1111, the active layer 150, the source 1121, and the drain 1122 form a thin film transistor. A corresponding thin film transistor is disposed in each pixel region, and whether a corresponding pixel region is displayed or not may be controlled by using the thin film transistor.

Further, as shown in FIGS. 3 and 6, the data line 1123 is in a concave-convex shape in an extending direction of the data line. That is, a surface of the data line 1123 is provided with a plurality of protruding portions and a plurality of recessed portions. The protruding portions and the recessed portions are alternately arranged in the extending direction of the data line 1123, to form the concave-convex shape. In this structure, during rolling or bending of the display panel, because the recessed portions are disposed on the surface of the data line 1123, the data line 1123 can better release a stress, to avoid the breakage of the data line 1123 caused by stress concentration. In the present embodiment, a cross-sectional shape of the recessed portion may be, but not limited to, an inverted trapezoid, an inverted triangle or an arc shape.

Further, as shown in FIGS. 1, 3, 4, and 6, the gate line 1112 is in a concave-convex shape in an extending direction of the gate line. That is, a surface of the gate line 1112 is provided with a plurality of protruding portions and a plurality of recessed portions. The protruding portions and the recessed portions are alternately arranged in the extending direction of the gate line 1112, to form the concave-convex shape. In this structure, during rolling or bending of the display panel, because the recessed portions are disposed on the surface of the gate line 1112, the gate line 1112 can better release a stress, to avoid the breakage of the gate line 1112 caused by stress concentration. In the present embodiment, a cross-sectional shape of the recessed portion may be, but not limited to, an inverted trapezoid, an inverted triangle or an arc shape.

Specifically, as shown in FIGS. 1 to 3, the metal layer 110 further includes a third metal layer 113 disposed between the first substrate 141 and the active layer 150. The insulating layer 130 further includes a fourth insulating layer 134 disposed between the third metal layer 113 and the active layer 150 and a fifth insulating layer 135 disposed between the third metal layer 113 and the first substrate 141. In the present embodiment, the third metal layer 113 may be configured to block light, to prevent the active layer 150 from being exposed to light to cause an offset of a threshold voltage of the thin film transistor.

It may be understood that according to selection of an actual case and specific requirements, a specific position of the third metal layer 113 may be appropriately adjusted. As shown in FIGS. 4 to 6, the metal layer 110 further includes a third metal layer 113 disposed between the first substrate 141 and the fourth insulating layer 134, and the insulating layer 130 further includes a fifth insulating layer 135 disposed between the first substrate 141 and the third metal layer 113, which can achieve the same technical effect.

In the display panel in the present embodiment of the present disclosure, the elastic conductive layer 160 is disposed on a surface of a side of the third metal layer 113 close to the fourth insulating layer 134 and/or a surface of a side of the third metal layer 113 close to the fifth insulating layer 135. That is, the elastic conductive layer 160 is disposed on an upper surface or a lower surface of the third metal layer 113, or the elastic conductive layer 160 may be disposed on an upper surface and a lower surface of the third metal layer 113 simultaneously.

Specifically, the elastic conductive layer 160 includes a first elastic conductive layer 161 and a second elastic conductive layer 162. The first elastic conductive layer 161 is disposed on the lower surface of the third metal layer 113 close to the fifth insulating layer 135. The second elastic conductive layer 162 is disposed on a lower surface of the second metal layer 112 close to the second insulating layer 132. It may be understood that according to selection of an actual case and specific requirements, the elastic conductive layer 160 may be alternatively disposed on the upper surface of the third metal layer 113, an upper surface of the first metal layer 111, a lower surface of the first metal layer 111, or an upper surface of the second metal layer 112. This is not uniquely limited herein.

Specifically, as shown in FIGS. 1 to 3, the third metal layer 113 includes a mask block 1131 and a clock signal line 1132. The clock signal line 1132 is the signal line 140 of the third metal layer 113. The mask block 1131 is disposed corresponding to the active layer 150. The mask block 1131 is connected to the clock signal line 1132. In this structure, the mask block 1131 may prevent the active layer 150 from being exposed to light and prevent the active layer 150 from being exposed to light to avoid the offset of the threshold voltage of the thin film transistor. In addition, the mask block 1131 and the clock signal line 1132 are disposed in the same layer, to simplify a manufacturing process of the display panel and improve production efficiency. In the present embodiment, the data line 1123 may be connected to the mask block 1131. The clock signal line 1132 transmits a clock signal to the data line 1123 through the mask block 1131.

Specifically, as shown in FIGS. 4 to 6, the third metal layer 113 includes a clock signal line 1132. The clock signal line 1132 is the signal line 140 of the third metal layer 113. The data line 1123 is connected to the clock signal line 1132, so that the clock signal line 1132 can transmit a clock signal to the data line 1123.

Further, as shown in FIGS. 1 and 4, a surface of the mask block 1131 is in a concave-convex shape. That is, the surface of the mask block 1131 is provided with a plurality of protruding portions and a plurality of recessed portions. The protruding portions and the recessed portions are alternately arranged, to form the concave-convex shape. In this structure, during rolling or bending of the display panel, because the recessed portions are disposed on the surface of the mask block 1131, the mask block 1131 can better release a stress, to avoid the breakage of the mask block 1131 caused by stress concentration. In the present embodiment, a cross-sectional shape of the recessed portion may be, but not limited to, an inverted trapezoid, an inverted triangle or an arc shape.

Further, as shown in FIGS. 2 and 5, the clock signal line 1132 is in a concave-convex shape in an extending direction of the clock signal line. That is, a surface of the clock signal line 1132 is provided with a plurality of protruding portions and a plurality of recessed portions. The protruding portions and the recessed portions are alternately arranged in the extending direction of the clock signal line 1132, to form the concave-convex shape. In this structure, during rolling or bending of the display panel, because the recessed portions are disposed on the surface of the clock signal line 1132, the clock signal line 1132 can better release a stress, to avoid the breakage of the clock signal line 1132 caused by stress concentration. In the present embodiment, a cross-sectional shape of the recessed portion may be, but not limited to, an inverted trapezoid, an inverted triangle or an arc shape.

Specifically, to ensure a buffering effect of the elastic conductive layer 160 (the first elastic conductive layer 161 and the second elastic conductive layer 162) and avoid excessively large elasticity of the elastic conductive layer 160, a tensile strength of the elastic conductive layer 160 is set between 800 N/mm$^2$ and 1500 N/mm$^2$. In the display panel in the present embodiment of the present disclosure, the tensile strength of the elastic conductive layer 160 is set to 800 N/mm$^2$, 900 N/mm$^2$, 1000 N/mm$^2$, 1100 N/mm$^2$, 1200 N/mm$^2$, 1300 N/mm$^2$, 1400 N/mm$^2$, or 1500 N/mm$^2$. Certainly, according to selection of an actual case and specific requirements, the tensile strength of the elastic conductive layer 160 may be appropriately adjusted. This is not uniquely limited herein.

Specifically, the elastic conductive layer 160 (the first elastic conductive layer 161 and the second elastic conductive layer 162) is made of a highly conductive material with elasticity, such as beryllium bronze or titanium bronze. In one aspect, a resistance of the metal layer 110 can be reduced and a signal delay can be reduced. In another aspect, the elastic conductive layer 160 can implement buffering, to prevent the metal layer 110 from breakage during rolling or bending. It may be understood that the elastic conductive layer 160 may be alternatively made of another conductive material. This is not uniquely limited herein.

Specifically, if the elastic conductive layer 160 has an excessively large thickness, during rolling or bending of the display panel, the elastic conductive layer 160 cannot implement adequate support due to an excessively large amount of deformation. If the elastic conductive layer 160 has an excessively small thickness, the elastic conductive layer cannot adequately release a bending or rolling stress. Therefore, the thickness of the elastic conductive layer 160 (the first elastic conductive layer 161 and the second elastic conductive layer 162) is set between 1 micrometer and 5 micrometers, to adequately avoid the problem.

In the display panel in the present embodiment of the present disclosure, the thickness of the elastic conductive layer 160 (the first elastic conductive layer 161 and the second elastic conductive layer 162) may be 1 micrometer, 1.5 micrometers, 2 micrometers, 2.5 micrometers, 3 micrometers, 3.5 micrometers, 4 micrometers, 4.5 micrometers or 5 micrometers. Certainly, according to selection of an actual case and specific requirements, the thickness of the elastic conductive layer 160 may be appropriately adjusted. This is not uniquely limited herein.

Specifically, the display panel further includes an elastic support layer 120 disposed between the metal layer 110 and the insulating layer 130. An elastic modulus of the elastic support layer 120 is less than an elastic modulus of the insulating layer 130. The display panel may include a plurality of metal layers 110, a plurality of insulating layers 130, at least one elastic support layer 120. The insulating layers 130 may be disposed on two opposite sides of each metal layer 110. At least one elastic support layer 120 is disposed between one metal layer 110 and a corresponding insulating layer 130.

In the display panel in the present embodiment of the present disclosure, the elastic support layer 120 is disposed between the metal layer 110 and the insulating layer 130. The elastic modulus of the elastic support layer 120 is less than the elastic modulus of the insulating layer 130. That is, elasticity of the elastic support layer 120 is greater than elasticity of the insulating layer 130. During rolling or bending of the display panel, the elastic support layer 120 can protect and buffer the metal layer 110 and does not scratch the metal layer 110, to effectively avoid the breakage of the metal layer 110.

Optionally, as shown in FIGS. 1 to 3, the elastic support layer 120 is disposed in at least one of a position between the first insulating layer 131 and the first metal layer 111, a position between the first metal layer 111 and the second insulating layer 132, a position between the second insulating layer 132 and the second metal layer 112 or a position between the second metal layer 112 and the third insulating layer 133.

Optionally, as shown in FIGS. 4 to 6, the elastic support layer 120 is disposed in at least one of a position between the fourth insulating layer 134 and the first metal layer 111, a position between the first metal layer 111 and the first insulating layer 131, a position between the second insulating layer 132 and the second metal layer 112 or a position between the second metal layer 112 and the third insulating layer 133. An elastic modulus of the elastic support layer 120 is less than an elastic modulus of the corresponding insulating layer 130.

In the present embodiment of the present disclosure, the elastic support layer 120 includes a first elastic support layer 121. The first elastic support layer 121 is disposed between the second metal layer 112 and the third insulating layer 133. That is, the first elastic support layer 121 is disposed above the second metal layer 112. An elastic modulus of the first elastic support layer 121 is less than the elastic modulus of the third insulating layer 133. During rolling or bending of the display panel, the elastic modulus of the first elastic support layer 121 is less than an elastic modulus of the second insulating layer 132, and the first elastic support layer 121 may protect and buffer the second metal layer 112, to prevent the third insulating layer 133 from scratching the second metal layer 112, thereby effectively avoiding the breakage of the second metal layer 112. It may be understood that according to selection of an actual case and specific requirements, the elastic support layer 120 may be alternatively disposed below the second metal layer 112, above the first metal layer 111 or below the first metal layer 111. This is not uniquely limited herein.

Specifically, the elastic support layer 120 is disposed between the third metal layer 113 and the fourth insulating layer 134; and/or the elastic support layer 120 is disposed between the third metal layer 113 and the fifth insulating layer 135. The elastic support layer 120 is disposed above or below the third metal layer 113. That is, elasticity of the elastic support layer 120 is greater than elasticity of the corresponding insulating layer 130. During rolling or bending of the display panel, the elastic support layer 120 can protect and buffer the third metal layer 113 and does not scratch the third metal layer 113, to effectively avoid the breakage of the third metal layer 113, thereby preventing leakage of light.

In the present embodiment of the present disclosure, the elastic support layer 120 includes a second elastic support layer 122. The second elastic support layer 122 is disposed between the third metal layer 113 and the fourth insulating layer 134. That is, the second elastic support layer 122 is disposed above the third metal layer 113. An elastic modulus of the second elastic support layer 122 is less than an elastic modulus of the fourth insulating layer 134. During rolling or bending of the display panel, the elastic modulus of the second elastic support layer 122 is less than the elastic modulus of the fourth insulating layer 134, and the second elastic support layer 122 may protect and buffer the third metal layer 113, to prevent the fourth insulating layer 134 from scratching the third metal layer 113, thereby effectively avoiding the breakage of the third metal layer 113. It may be understood that according to selection of an actual case and specific requirements, the elastic support layer 120 may be alternatively disposed below the third metal layer 113 (that is, between the third metal layer 113 and the fifth insulating layer 135). This is not uniquely limited herein.

Specifically, the elastic modulus of the elastic support layer 120 greatly affects protection and buffering effects. If the elastic support layer 120 has an excessively large elastic modulus, the elastic support layer 120 easily scratches the metal layer 110. If the elastic support layer 120 has an excessively small elastic modulus, the elastic support layer 120 cannot implement adequate support, to reduce reliability of the display panel. Therefore, the elastic modulus of the elastic support layer 120 (the first elastic support layer 121 and the second elastic support layer 122) may be set between 1 MPa and 80 MPa, to adequately avoid the problem.

In the display panel in the present embodiment of the present disclosure, the elastic modulus of the elastic support layer 120 (the first elastic support layer 121 and the second elastic support layer 122) may be 1 MPa, 5 MPa, 10 MPa, 15 MPa, 20 MPa, 25 MPa, 30 MPa, 35 MPa, MPa, 45 MPa, 50 MPa, 55 MPa, 60 MPa, 65 MPa, 70 MPa, 75 MPa or 80 MPa. Certainly, according to selection of an actual case and specific requirements, the elastic modulus of the elastic support layer 120 may be appropriately adjusted. This is not uniquely limited herein.

Specifically, if the elastic support layer 120 has an excessively large thickness, during rolling or bending of the display panel, the elastic support layer 120 cannot implement adequate support due to an excessively large amount of deformation. If the elastic support layer 120 has an excessively small thickness, the elastic support layer cannot adequately release a bending or rolling stress. Therefore, the thickness of the elastic support layer 120 (the first elastic support layer 121 and the second elastic support layer 122) is set between 2 micrometers and 10 micrometers, to adequately avoid the problem.

In the display panel in the present embodiment of the present disclosure, the thickness of the elastic support layer 120 (the first elastic support layer 121 and the second elastic support layer 122) may be 2 micrometers, 3 micrometers, 4 micrometers, 5 micrometers, 6 micrometers, 7 micrometers, 8 micrometers, 9 micrometers or 10 micrometers. Certainly, according to selection of an actual case and specific requirements, the thickness of the elastic support layer 120 may be appropriately adjusted. This is not uniquely limited herein.

Specifically, a material of the first metal layer 111 and a material of the second metal layer 112 may be selected from one or more of copper, molybdenum, titanium, silver, indium tin oxide (ITO), and the like. It may be understood that according to selection of an actual case and specific requirements, the material of the first metal layer 111 and the material of the second metal layer 112 may be appropriately modified. This is not uniquely limited herein.

Specifically, a material of the third metal layer 113 is selected from one or more of copper, molybdenum, titanium, aluminum, silver, and the like. It may be understood that according to selection of an actual case and specific requirements, the material of the third metal layer 113 may be appropriately modified. This is not uniquely limited herein.

Specifically, a material of the elastic support layer 120 (the first elastic support layer 121 and the second elastic support layer 122) is an insulating material and is specifically selected from one or more of polydimethylsiloxane (PDMS), PI, polyolefin elastomer (POE), and ethylene-vinyl acetate copolymer (EVA). It may be understood that according to selection of an actual case and specific requirements, the material of the elastic support layer 120 may be appropriately modified. This is not uniquely limited herein.

Specifically, it may be understood that a material of the first insulating layer 131 and a material of the second insulating layer 132 may be selected from one or more of silicon oxide, silicon nitride, and silicon oxycarbide. Certainly, according to selection of an actual case and specific requirements, the material of the first insulating layer 131 and the material of the second insulating layer 132 may be appropriately modified. This is not uniquely limited herein.

Specifically, as shown in FIGS. 1 to 6, the display panel further includes a first buffer layer 143 and a second substrate 142. The second substrate 142 is made of a flexible material, which may be specifically, but not limited to, PI. The first buffer layer 143 is disposed on the first substrate 141. The second substrate 142 is disposed on the first buffer layer 143. The fifth insulating layer 135 is disposed on the second substrate 142.

Specifically, the display panel further includes a second buffer layer 144. As shown in FIGS. 1 to 3, the second buffer layer 144 is disposed between the fourth insulating layer 134 and the active layer 150. The second insulating layer 132 covers the second buffer layer 144. As shown in FIGS. 4 to 6, the second buffer layer 144 is disposed between the fourth insulating layer 134 and the first metal layer 111. The first insulating layer 131 covers the second buffer layer 144.

Specifically, a material of the fifth insulating layer 135, a material of the first buffer layer 143, and a material of the second buffer layer 144 may be selected from one or more of silicon oxide, silicon nitride, silicon oxynitride, and amorphous silicon. In the present embodiment, the fifth insulating layer 135 is mainly used as a buffer structure layer, so that the third metal layer 113 or the elastic conductive layer 160 is attached to the fifth insulating layer 135.

Specifically, the display panel further includes an OLED light-emitting unit 200. The OLED light-emitting unit 200 includes a first electrode 210, a pixel defining layer 220, a light-emitting function layer 230, and a second electrode 240. The first electrode 210 is disposed on the third insulating layer 133. The first electrode 210 is connected to the drain 1122. The pixel defining layer 220 is disposed on the third insulating layer 133 and the first electrode 210. The pixel defining layer 220 is provided with a pixel opening 221. The first electrode 210 is exposed from the pixel opening 221. The light-emitting function layer 230 is disposed in the pixel opening 221. The second electrode 240 covers the light-emitting function layer 230 and the pixel defining layer 220. In the present embodiment, the first electrode 210 may be an anode. The second electrode 240 may be a cathode. A material of the anode may be selected from one or more of conductive materials such as ITO, silver, and IZO. A material of the cathode may be selected from one or more of conductive materials such as magnesium and silver. Certainly, according to selection of an actual case and specific requirements, the first electrode 210 may be alternatively a cathode, and the second electrode 240 may be alternatively an anode. This is not uniquely limited herein.

Specifically, the light-emitting function layer 230 includes a hole injection layer, a hole transport layer, an organic light-emitting layer, an electron transport layer, and an electron injection layer that are stacked in sequence in a direction from the anode to the cathode.

Referring to FIG. 7 and also referring to FIGS. 1 to 3, an embodiment of the present disclosure further provides a method for manufacturing a display panel. The method includes steps of:

Step B1. Form a first substrate 141.

Step B2. Form a drive circuit layer 100 on the first substrate 141. The drive circuit layer 100 includes a metal layer 110, an elastic support layer 120, and an insulating layer 130. The insulating layer 130 is disposed on a side of the metal layer 110. The elastic support layer 120 is disposed between the metal layer 110 and the insulating layer 130. An elastic modulus of the elastic support layer 120 is less than an elastic modulus of the insulating layer 130.

Step B3. Form an OLED light-emitting unit 200 on the drive circuit layer 100.

Specifically, a specific manner of step B1 may be: forming a sacrificial layer 400 on a glass substrate 300 by using a chemical vapor deposition (CVD) method, and then the first substrate 141 is formed by coating. In the present embodiment, the sacrificial layer 400 may be specifically amorphous silicon. After a display panel is manufactured, the first substrate 141 may be separated from the glass substrate 300 by exposing the sacrificial layer 400.

Specifically, as shown in FIGS. 1 to 3, the manufactured display panel is a top-gate display panel. The metal layer 110 includes a third metal layer 113, a first metal layer 111, and a second metal layer 112. The insulating layer 130 includes a first insulating layer 131, a second insulating layer 132, a third insulating layer 133, a fourth insulating layer 134, and a fifth insulating layer 135. Step B2 may include steps of:

Step B21. Form a first buffer layer 143 on the first substrate 141 by CVD, and perform high-temperature annealing on the first buffer layer 143. A second substrate 142 is formed on the first buffer layer 143 by coating. The fifth insulating layer 135 is formed on the second substrate 142 by CVD.

Step B22. Form a first elastic conductive layer 161 on the fifth insulating layer 135 by physical vapor deposition (PVD), form the third metal layer 113 on the first elastic conductive layer 161 by PVD, form a photoresist mask pattern on the third metal layer 113 by using a photolithography process, and etch the first elastic conductive layer 161 and the third metal layer 113 by using a hydrogen peroxide etching solution and by using the photoresist mask pattern as a shield, to obtain a patterned first elastic conductive layer 161 and a patterned third metal layer 113.

Step B23. Form a second elastic support layer 122 on the third metal layer 113 and the fifth insulating layer 135 by coating. The fourth insulating layer 134 is formed on the second elastic support layer 122 by coating. A second buffer layer 144 is formed on the fourth insulating layer 134 by CVD, and high-temperature annealing is performed on the second buffer layer 144.

Step B24. Form an active layer 150 on the second buffer layer 144 by physical vapor sputtering, form a photoresist mask pattern on the active layer 150 by using the photolithography process, and etch the active layer 150 by using an oxalic acid etching solution and by using the photoresist mask pattern as a shield, to obtain a patterned active layer 150.

Step B25. Form the first insulating layer 131 on the second buffer layer 144 and the active layer 150 by CVD, form the first metal layer 111 on the first insulating layer 131 by PVD, form a photoresist mask pattern on the first metal layer 111 by using the photolithography process, and etch the first metal layer 111 and the first insulating layer 131 by using the photoresist mask pattern as a shield, to obtain a patterned first metal layer 111 and a patterned first insulating layer 131. Conductor treatment is performed on the active layer 150 by using the patterned first metal layer 111 as a shield.

Step B26. Form the second insulating layer 132 on the first insulating layer 131 and the first metal layer 111 by CVD.

Step B27. Form a second elastic conductive layer 162 on the second insulating layer 132 by PVD, form the second metal layer 112 on the second elastic conductive layer 162 by PVD, form a photoresist mask pattern on the second metal layer 112 by using the photolithography process, and etch the second elastic conductive layer 162 and the second metal layer 112 by using a hydrogen peroxide etching solution and by using the photoresist mask pattern as a shield, to obtain a patterned second elastic conductive layer 162 and a patterned second metal layer 112.

Step B28. Form a first elastic support layer 121 on the second metal layer 112 and the second insulating layer 132 by coating. The third insulating layer 133 is formed on the first elastic support layer 121 by coating.

Specifically, as shown in FIGS. 4 to 6, the manufactured display panel is a bottom-gate display panel. The metal layer 110 includes a third metal layer 113, a first metal layer 111, and a second metal layer 112. The insulating layer 130 includes a first insulating layer 131, a second insulating layer 132, a third insulating layer 133, a fourth insulating layer 134, and a fifth insulating layer 135. Step B2 may include steps of:

Step B21'. Form a first buffer layer 143 on the first substrate 141 by CVD, and perform high-temperature annealing on the first buffer layer 143. A second substrate 142 is formed on the first buffer layer 143 by coating. The fifth insulating layer 135 is formed on the second substrate 142 by CVD.

Step B22'. Form a first elastic conductive layer 161 on the fifth insulating layer 135 by PVD, form the third metal layer 113 on the first elastic conductive layer 161 by physical vapor sputtering, form a photoresist mask pattern on the third metal layer 113 by using a photolithography process, and etch the first elastic conductive layer 161 and the third metal layer 113 by using a hydrogen peroxide etching solution and by using the photoresist mask pattern as a shield, to obtain a patterned first elastic conductive layer 161 and a patterned third metal layer 113.

Step B23'. Form a second elastic support layer 122 on the third metal layer 113 and the fifth insulating layer 135 by coating. The fourth insulating layer 134 is formed on the second elastic support layer 122 by coating. A second buffer layer 144 is formed on the fourth insulating layer 134 by CVD, and high-temperature annealing is performed on the second buffer layer 144.

Step B24'. Form the first metal layer 111 on the second buffer layer 144 by PVD, form a photoresist mask pattern on the first metal layer 111 by using the photolithography process, and etch the first metal layer 111 by using the photoresist mask pattern as a shield, to obtain a patterned first metal layer 111. The first insulating layer 131 is formed on the second buffer layer 144 and the first metal layer 111 by CVD.

Step B25'. Form an active layer 150 on the first insulating layer 131 by physical vapor sputtering, form a photoresist mask pattern on the active layer 150 by using the photolithography process, and etch the active layer 150 by using an oxalic acid etching solution and by using the photoresist mask pattern as a shield, to obtain a patterned active layer 150. Conductor treatment is performed on the active layer 150.

Step B26'. Form the second insulating layer 132 on the first insulating layer 131 and the active layer 150 by CVD.

Step B27'. Form a second elastic conductive layer 162 on the second insulating layer 132 by PVD, form the second metal layer 112 on the second elastic conductive layer 162 by PVD, form a photoresist mask pattern on the second metal layer 112 by using the photolithography process, and etch the second elastic conductive layer 162 and the second metal layer 112 by using a hydrogen peroxide etching solution and by using the photoresist mask pattern as a shield, to obtain a patterned second elastic conductive layer 162 and a patterned second metal layer 112.

Step B28'. Form a first elastic support layer 121 on the second metal layer 112 and the second insulating layer 132 by coating. The third insulating layer 133 is formed on the first elastic support layer 121 by coating.

Specifically, the third metal layer 113 includes a mask block 1131 and a clock signal line 1132, and a surface of the mask block 1131 and the clock signal line 1132 are both in a concave-convex shape in extending directions of the mask block and the clock signal line. In step B21 or step B21', after the first buffer layer 143 is formed, a plurality of grooves are formed on the first buffer layer 143 by dry etching, and a cross-section shape of the groove may be, but not limited to, an inverted trapezoid, an inverted triangle or an arc shape, so that the first elastic conductive layer 161 and the third metal layer 113 formed subsequently form a recessed portion in a region of a corresponding groove. A protruding portion is formed between two adjacent recessed portions. The protruding portion and the recessed portion are alternately arranged. Therefore, the surface of the mask block 1131 and the clock signal line 1132 are both in the concave-convex shape in the extending directions of the mask block and the clock signal line. In the present embodiment, the fourth insulating layer 134 formed subsequently has a flat upper surface, to facilitate subsequent manufacturing of another structure layer.

Specifically, the second metal layer 112 includes a data line 1123. The data line 1123 is in a concave-convex shape in an extending direction of the data line. In step B26 or step B26', after the second insulating layer 132 is formed, a plurality of grooves are formed on the second insulating layer 132 by dry etching. For example, the plurality of grooves are formed on the second insulating layer 132 by etching the second insulating layer 132 by using an oxidizing gas containing fluorine. A cross-section shape of the groove may be, but not limited to, an inverted trapezoid, an inverted triangle or an arc shape, so that the second elastic conductive layer 162 and the second metal layer 112 formed subsequently form a recessed portion in a region of a corresponding groove. A protruding portion is formed between two adjacent recessed portions. The protruding portion and the recessed portion are alternately arranged. Therefore, the data line 1123 is in the concave-convex shape in the extending direction of the data line. In the present embodiment, the third insulating layer 133 formed subsequently has a flat upper surface, to facilitate subsequent manufacturing of another structure layer.

Specifically, the OLED light-emitting unit 200 includes a first electrode 210, a pixel defining layer 220, a light-emitting function layer 230, and a second electrode 240. Step B3 may specifically include steps of:

Step B31. Form the first electrode 210 on the third insulating layer 133 by evaporation and/or PVD.

Step B32. Form the pixel defining layer 220 on the third insulating layer 133 and the first electrode 210 by coating, and pattern the pixel defining layer 220, to form a pixel opening 221 on the pixel defining layer 220. The first electrode 210 is exposed from the pixel opening 221.

Step B33. Form the light-emitting function layer 230 in the pixel opening 221 by evaporation or ink-jet printing. The light-emitting function layer 230 includes a hole injection layer, a hole transport layer, an organic light-emitting layer, an electron transport layer, and an electron injection layer from bottom to top.

Step B34. Form the second electrode 240 on the pixel defining layer 220 and the light-emitting function layer 230 by evaporation.

The display panel provided in the embodiments of the present disclosure is described in detail above. The principles and implementations of the present disclosure are described through specific examples in this specification, and the descriptions of the embodiments are only intended to help understand the methods and core ideas of the present disclosure. Meanwhile, a person of ordinary skill in the art may make modifications to the specific implementations and application scopes according to the ideas of the present disclosure. In conclusion, the content of the specification should not be construed as a limitation to the present disclosure.

What is claimed is:

1. A display panel, comprising:
   a first substrate,
   an active layer, a first insulating layer, a second insulating layer, and a third insulating layer,
   a metal layer comprising a first metal layer and a second metal layer, wherein the metal layer is disposed on the first substrate and comprises a signal line, the active layer is disposed on the first substrate, the first insulating layer is disposed on the active layer, the first metal layer is disposed on the first insulating layer, the second insulating layer covers the active layer and the first metal layer, and the third insulating layer covers the second metal layer and the second insulating layer; and
   an elastic conductive layer disposed on a surface of the metal layer, wherein a tensile strength of the elastic conductive layer is greater than a tensile strength of the metal layer;
   wherein a part of the elastic conductive layer corresponding to the signal line is provided with a plurality of protruding portions and a plurality of recessed portions protruded or recessed in a direction perpendicular to an extending direction of the signal line, the plurality of protruding portions and the plurality of recessed portions are alternately arranged in the extending direction of the signal line, and a distance between an upper surface of each of the plurality of protruding portions and the first substrate is different from a distance between an upper surface of each of the plurality of recessed portions and the first substrate; and
   wherein the elastic conductive layer is disposed on at least one surface of a surface of a side of the first metal layer close to the first insulating layer, a surface of a side of the first metal layer away from the first insulating layer, a surface of a side of the second metal layer close to the second insulating layer or a surface of a side of the second metal layer close to the third insulating layer.

2. The display panel as claimed in claim 1, wherein the tensile strength of the elastic conductive layer is between 800 N/mm$^2$ and 1500 N/mm$^2$; and a thickness of the elastic conductive layer is between 1 micrometer and 5 micrometers.

3. The display panel as claimed in claim 1, wherein a material of the elastic conductive layer is beryllium bronze or titanium bronze.

4. The display panel as claimed in claim 1, wherein the first metal layer comprises a gate and a gate line, the gate is disposed corresponding to the active layer, and the gate is connected to a corresponding gate line; and
   the second metal layer comprises a source, a drain, and a data line, the source is in contact with one end of a corresponding active layer, the drain is in contact with another end of the corresponding active layer, and the source is connected to a corresponding data line.

5. The display panel as claimed in claim 4, wherein the gate line is in a concave-convex shape in an extending direction of the gate line; or the data line is in a concave-convex shape in an extending direction of the data line.

6. A display panel comprising:

a first substrate, an active layer, a first insulating layer, a second insulating layer, a third insulating layer, and a fourth insulating layer, a metal layer comprising a first metal layer and a second metal layer, wherein the metal layer is disposed on the first substrate and comprises a signal line; the fourth insulating layer is disposed on the first substrate, the first metal layer is disposed on the fourth insulating layer, the first insulating layer covers the first metal layer, the active layer is disposed on the first insulating layer, the second insulating layer covers the active layer, the second metal layer is disposed on the second insulating layer, and the third insulating layer covers the second metal layer; and an elastic conductive layer disposed on a surface of the metal layer, wherein a tensile strength of the elastic conductive layer is greater than a tensile strength of the metal layer, and the elastic conductive layer is disposed on at least one surface of a surface of a side of the first metal layer close to the first insulating layer, a surface of a side of the first metal layer close to the fourth insulating layer, a surface of a side of the second metal layer close to the second insulating layer or a surface of a side of the second metal layer close to the third insulating layer; and wherein a part of the elastic conductive layer corresponding to the signal line is provided with a plurality of protruding portions and a plurality of recessed portions protruded or recessed in a direction perpendicular to an extending direction of the signal line, the plurality of protruding portions and the plurality of recessed portions are alternately arranged in the extending direction of the signal line, and a distance between an upper surface of each of the plurality of protruding portions and the first substrate is different from a distance between an upper surface of each of the plurality of recessed portions and the first substrate.

7. The display panel as claimed in claim 6, wherein the first metal layer comprises a gate and a gate line, the gate is disposed corresponding to the active layer, and the gate is connected to a corresponding gate line; and the second metal layer comprises a source, a drain, and a data line, the source is in contact with one end of a corresponding active layer, the drain is in contact with another end of the corresponding active layer, and the source is connected to a corresponding data line.

8. The display panel as claimed in claim 7, wherein the gate line is in a concave-convex shape in an extending direction of the gate line; or the data line is in a concave-convex shape in an extending direction of the data line.

9. The display panel as claimed in claim 1, wherein the metal layer further comprises a third metal layer disposed between the first substrate and the active layer, a fourth insulating layer disposed between the third metal layer and the active layer, and a fifth insulating layer disposed between the third metal layer and the first substrate.

10. The display panel as claimed in claim 9, wherein the elastic conductive layer is disposed on a surface of a side of the third metal layer close to the fourth insulating layer; and/or the elastic conductive layer is disposed on a surface of a side of the third metal layer close to the fifth insulating layer.

11. The display panel as claimed in claim 6, wherein the metal layer further comprises a third metal layer disposed between the first substrate and the fourth insulating layer and a fifth insulating layer disposed between the first substrate and the third metal layer.

12. The display panel as claimed in claim 11, wherein the elastic conductive layer is disposed on a surface of a side of the third metal layer close to the fourth insulating layer; or the elastic conductive layer is disposed on a surface of a side of the third metal layer close to the fifth insulating layer.

13. The display panel as claimed in claim 9, wherein the third metal layer comprises a mask block and a clock signal line, the mask block is disposed corresponding to the active layer, and the mask block is connected to the clock signal line.

14. The display panel as claimed in claim 13, wherein the clock signal line is in a concave-convex shape in an extending direction of the clock signal line.

15. The display panel as claimed in claim 11, wherein the third metal layer comprises a clock signal line.

16. The display panel as claimed in claim 15, wherein the clock signal line is in a concave-convex shape in an extending direction of the clock signal line.

17. The display panel as claimed in claim 1, further comprising an insulating layer disposed on a side of the metal layer and an elastic support layer disposed between the metal layer and the insulating layer, wherein an elastic modulus of the elastic support layer is less than an elastic modulus of the insulating layer.

18. The display panel as claimed in claim 17, wherein the elastic modulus of the elastic support layer is between 1 MPa and 80 MPa; and a thickness of the elastic support layer is between 2 micrometers and 10 micrometers.

19. The display panel as claimed in claim 11, wherein the third metal layer comprises a mask block and a clock signal line, the mask block is disposed corresponding to the active layer, and the mask block is connected to the clock signal line.

20. The display panel as claimed in claim 19, wherein the clock signal line is in a concave-convex shape in an extending direction of the clock signal line.

* * * * *